(12) United States Patent
Többen et al.

(10) Patent No.: US 6,235,574 B1
(45) Date of Patent: May 22, 2001

(54) HIGH PERFORMANCE DRAM AND METHOD OF MANUFACTURE

(75) Inventors: Dirk Többen, Fishkill; Johann Alsmeier, Wappingers Falls, both of NY (US)

(73) Assignee: Infineon North America Corp., San Jose, CA (US)

( * ) Notice: Subject to any disclaimer, the term of this patent is extended or adjusted under 35 U.S.C. 154(b) by 0 days.

(21) Appl. No.: 09/568,064

(22) Filed: May 10, 2000

Related U.S. Application Data (62) Division of application No. 09/273,402, filed on Mar. 22, 1999.

(51) Int. Cl.$^7$ .................................................. H01L 27/108
(52) U.S. Cl. .......................................... 438/241; 438/210
(58) Field of Search .................................. 438/458, 210, 438/241, 380, 977, 928; 437/170, 905; 148/DIG. 12

(56) References Cited

U.S. PATENT DOCUMENTS

| | | | |
|---|---|---|---|
| 6,015,730 | * | 3/1998 | Wang et al. . |
| 6,144,056 | * | 7/1998 | Manning . |
| 6,153,459 | * | 11/1998 | Sun . |

* cited by examiner

*Primary Examiner*—George Fourson
*Assistant Examiner*—Thanh V. Pham
(74) *Attorney, Agent, or Firm*—Stanton Braden

(57) ABSTRACT

A process for forming a DRAM in a silicon chip that includes N-MOSFETs of the memory cells in its central area and C-MOSFETs of the support circuitry in the peripheral area. By the inclusion of a masking oxide layer over the peripheral area during the formation of the memory cells, there are formed N-MOSFETs that use N-doped polycide gates and P-MOSFETs that use P-doped polycide gates. The sources and drains include self-aligned silicide contacts.

6 Claims, 6 Drawing Sheets

FIG. 17

HIGH PERFORMANCE DRAM AND METHOD OF MANUFACTURE

This is a divisional, of application Ser. No. 09/273,402 filed Mar. 22, 1999.

FIELD OF INVENTION

This invention relates to a dynamic random access memory (DRAM), and more particularly, to a DRAM in which the complementary transistors in the support circuitry have dual work-function gates.

BACKGROUND OF THE INVENTION

Presently a state-of-the-art DRAM comprises a silicon chip in whose central (array) area is disposed an array of memory cells that are arranged in rows and columns and in whose peripheral area is disposed the support circuitry for reading in and reading out binary digits (bits) stored in the memory cells. Generally at the present state of the art, each memory cell includes an N-channel metal-oxide-semiconductor field effect transistor (N-MOSFET) and the support circuitry includes both N-MOSFETs and P-channel metal-oxide-semiconductor field effect transistors (P-MOSFETs) which are commonly known as complementary metal-oxide semiconductor field effect transistors (C-MOSFETs). In most state-of-the-art DRAMs, both the array transistors and the support transistors use polycide (such as $WSi_x$) gates that are formed as stacks that are essentially identical for all transistors. This approach is cost-effective since it permits all gates to be deposited and patterned simultaneously, ensuring ease and reduced cost of manufacture. Typically the stacks are sequential layers of n-type doped polysilicon, a polycide, and a silicon nitride cap. This however poses limitations on the DRAM performance, particularly with respect to the P-MOSFET in the support circuitry. This will become more serious in the future when enhanced performance of the support circuitry will be necessary to cope with the improved performance requirements that will then be needed.

Also, DRAM technology typically aims to reduce the cell size in the arrays to permit higher density and increased productivity. One of the most effective ways to reduce the array cell size is to use borderless contacts to the source/drain regions (the output of the transistor typically coupled to a bit line of the DRAM) of the transistors of the memory cell. This requires a relatively thick SiN cap on top of the electrically conducting portion of the gate stack. Such a cap, which is also needed in the support circuitry, adds difficulty to line width control during etching, which in turn makes difficult control of gate width, another important factor in device performance.

High performance logic circuits, on the other hand, typically are now manufactured with n-type and p-type doped polysilicon as part of the gate stack for N-MOSFETs and P-MOSFETs, respectively, which is generally described as a dual work-function stack. These are manufactured with so-called salicide (self-aligned suicide) processes that simultaneously dope the gate polysilicon as well as the silicon substrate to form the source and drain diffusion regions. The absence of the need of the SiN cap in this approach results in better line-width control. The disadvantage to this approach is the need for additional masks. This increases the process complexity as well as a reduction in the allowed thermal budget because of the large thermal diffusion constant of the p-type dopant (typically boron). This factor limits the use of the anneal steps generally used to reflow the customary borophospho-silicate glasses (BPSG) because of the high aspect ratio of the spaces between gates in the circuitry.

SUMMARY OF THE INVENTION

In one aspect the present invention is directed to a method for manufacturing high-performance DRAMs using conventional technology in a novel fashion to provide dual work-function gates for C-MOSFETs transistors of the support circuitry so that improved performance becomes possible for the support circuitry. In particular, the novel process advantageously involves use in the support circuitry of the salicide gate approach common in the CMOS-technology generally now limited to use for high-speed low power logic circuitry.

In particular, the process flow involved is one that does not compromise the ground rules applicable to the array transistors of the individual cells, but does provide for the desired dual work-function gates in the CMOS support circuitry transistors and involves a thermal budget that is consistent with high electrical performance of the final product.

More particularly, the method of the present invention effectively decouples the patterning and gap-filling steps in the manufacture of the array transistors from these steps in the manufacture of support circuitry transistors by the initial inclusion of an etch stop layer, for example of silicon oxide, in the multilayer stack used to form the support circuitry transistors. In addition, a polycide layer is part of the gate stack only of the array transistors and so the support circuitry transistors can be readily made using conventional salicide techniques. Finally, the process steps are arranged such that the thermal budget is significant in the manufacture only of the array transistors where the type dopants for which the thermal budget is critical have not yet been introduced into the silicon chip. Additionally, the process permits the spaces between the support circuitry gates to have a reduced aspect ratio so that they can be filled at lower temperatures than would otherwise be the case.

Accordingly, the invention may be viewed broadly as a process for preparing a DRAM in a semiconductor body, such as a silicon chip, in which the memory cells are arrayed in the central area of the chip and the support circuitry is formed in its peripheral area. As is characteristic of state-of-the art DRAMs, the memory cell transistors are all N-MOSFETs and support circuitry includes both N-MOSFETs and P-MOSFETs. An important feature is that each of the array N-MOSFETS includes an N-doped polycide gate contact and each of the MOSFETs of the support circuitry includes appropriately doped polysilicon gates. A related feature is that source, drain and gate contacts of the support circuitry transistors are all formed by a self-aligned technique that results in borderless salicide contacts.

Viewed from an apparatus aspect, the present invention is directed to a DRAM that comprises a silicon chip in whose central area are formed an array of memory cells each including an N-MOSFET and in whose peripheral area are formed the support circuitry including both N-MOSFETs and P-MOSFETs characterized in that the N-MOSFETs in the memory cells use N-doped polycide gates, the N-MOSFETs in the support circuitry use N-doped polysilicon gates and the P-MOSFETs in the support circuitry use P-doped polysilicon gates.

Viewed from a method aspect, the present invention is directed to a method for forming a DRAM that comprises a silicon chip in which the central area of the chip includes arrays of memory cells that use N-MOSFETs and the peripheral area of the chip includes support circuitry that uses C-MOSFETs. The method comprises the steps of: forming over the surface of the chip area a masking layer of silicon oxide and removing the layer selectively from the central portion where the memory cell arrays are to be included, but leaving it in place in the peripheral portion where the support circuitry is to be included; forming the N-MOSFETs of the memory cells in the central area and including in such N-MOSFETs gate conductors that include an underlying polysilicon layer that is doped with donor atoms and an overlying layer that is a metal silicide; covering the chip area with a masking layer and removing the masking layer selectively from the central area of the chip; removing said silicon oxide layer from the peripheral portion of the chip area; covering said peripheral portion with a masking layer and removing it where N-MOSFETs are to be formed; forming the N-MOSFETs of the support circuitry in the peripheral portion and including in such N-MOSFETs gate conductors that include an underlying polysilicon layer that is doped with donor atoms and an overlying layer that is a metal suicide; covering the peripheral area with a masking layer and removing it where P-MOSFETs are to be formed; and forming the P-MOSFETs of the support circuitry in the peripheral portion and including in such P-MOSFETs gate conductors that include an underlying silicon layer that is doped with acceptor atoms and an overlying layer of a metal silicide.

The invention will be better understood from the following more detailed description taken in conjunction with the accompanying drawings.

BRIEF DESCRIPTION OF THE DRAWINGS

It is to be noted that the drawing is not to scale.

DETAILED DESCRIPTION

As is known, in the manufacture of silicon integrated circuits, it is conventional to do most of the processing on a relatively large silicon wafer after which the wafer is diced into individual silicon chips that include the desired integrated circuit. It will facilitate a description of the process of the invention if the description will be primarily in terms of a single chip in which is to be formed a single DRAM. There should be little difficulty in extrapolating the description to wafer scale processing.

Figure 1:
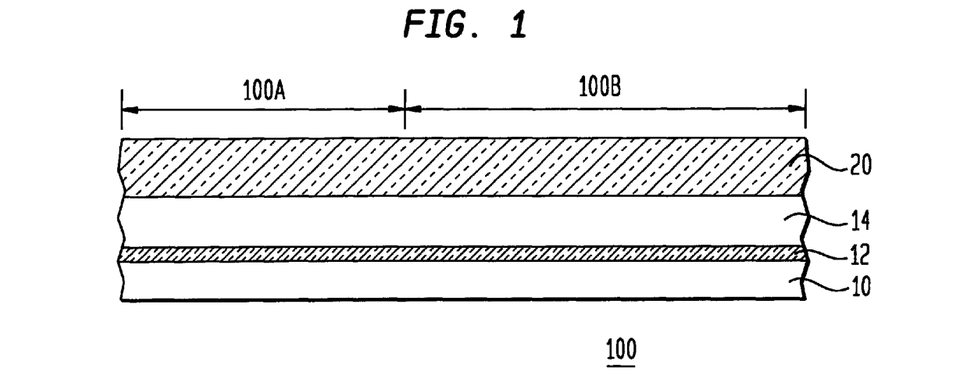
FIGS. 1–17 show, in cross section at various successive stages of manufacture, a portion of a silicon chip in which are being formed both an N-MOSFET transistor suitable for use as a memory cell array transistor and a complementary pair of an N-MOSFET and a P-MOSFET for use in the support circuitry.

FIG. 1 shows a portion of a silicon wafer that will be the workpiece that comprises multilayer stack 100 that includes an array portion 100A where there are to be formed the N-MOSFETs to be used in the array of memory cells of a DRAM, and a portion 100B where there are to be formed complementary N-MOSFETs and P-MOSFETs to be used in the support circuitry of the DRAM. Typically the support circuitry is concentrated in regions that border the regions where the memory cells are concentrated. The stack 100 illustratively comprises a monocrystalline silicon substrate 10 in which there will be included the various diffused wells, trenches and other regions that need to be in the silicon substrate to form and isolate the various circuit devices that are needed for a DRAM. These have not been shown in the drawing since these can be formed in a fashion appropriate for the particular type of DRAM desired.

The stack 100, typically is prepared as follows. A gate oxide layer 12 is grown over a top surface of a monocrystalline p-type silicon substrate 10 and this is followed by the blanket deposition in turn of an undoped polysilicon layer 14 and a silicon oxide layer 20. As used herein, by "undoped" is meant essentially free of the dopants normally added to control the conductivity and conductivity type.

Figure 2:
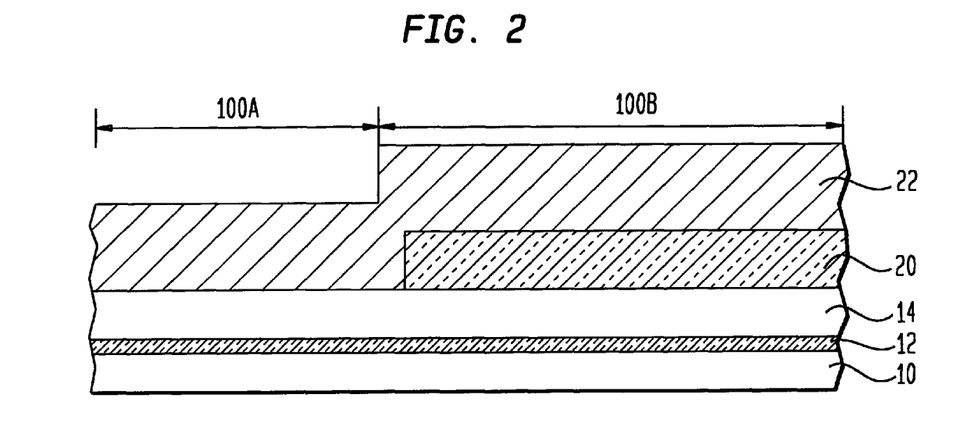

The silicon oxide 20, after suitable masking, is etched to leave it only in the portion corresponding approximately to the support portion 100B. Then the mask is stripped and the top of the stack 100 is covered with a layer 22 of a suitable polycide, for example tungsten silicide (WSi), for example by either sputtering or chemical vapor deposition (CVD). In some instances, it may improve the sticking of the polycide being deposited if a thin liner-layer of polysilicon (not shown) is first deposited over the silicon oxide. The resulting stack is shown as FIG. 2.

Figure 3:
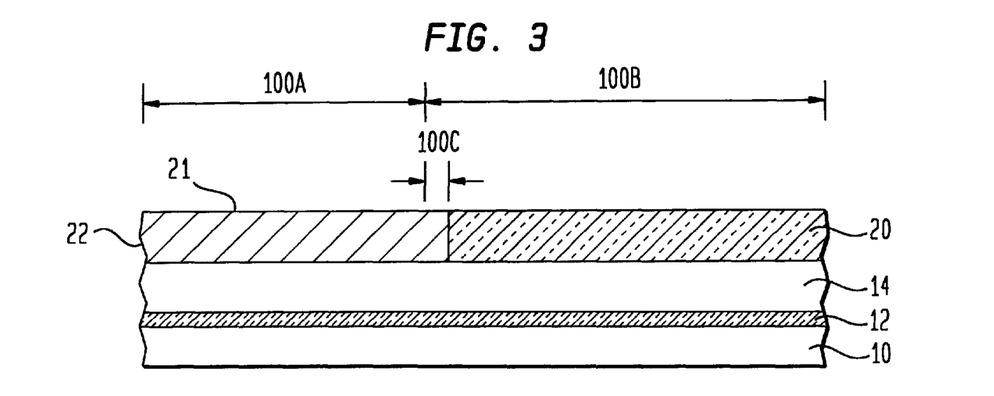

Chemical mechanical polishing (CMP) is then used to etch the polycide layer 22 selectively with respect to the silicon oxide layer 20 with the silicon oxide 20 acting as an etch stop. A hard polishing pad advantageously is used to avoid excessive dishing in region 100A. As seen in FIG. 3, the result is that a top surface 21 of the stack, formed in part by the polycide 22 and in part by silicon oxide 20, is planar, with the polycide layer 22 being approximately limited to array portion 100A and the silicon oxide layer 20 being approximately limited to the support portion 100B. Advantageously, the polycide layer 22 encroaches slightly into the support portion 100B of the stack, as is shown.

Figure 4:
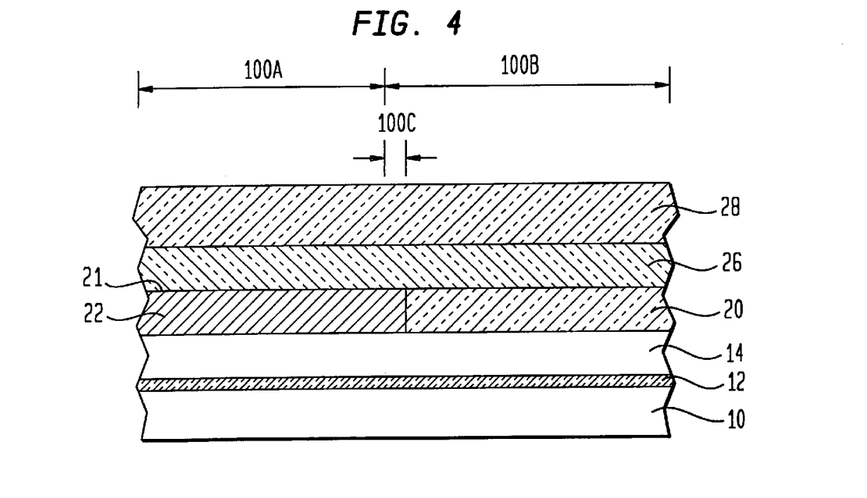
Figure 5:
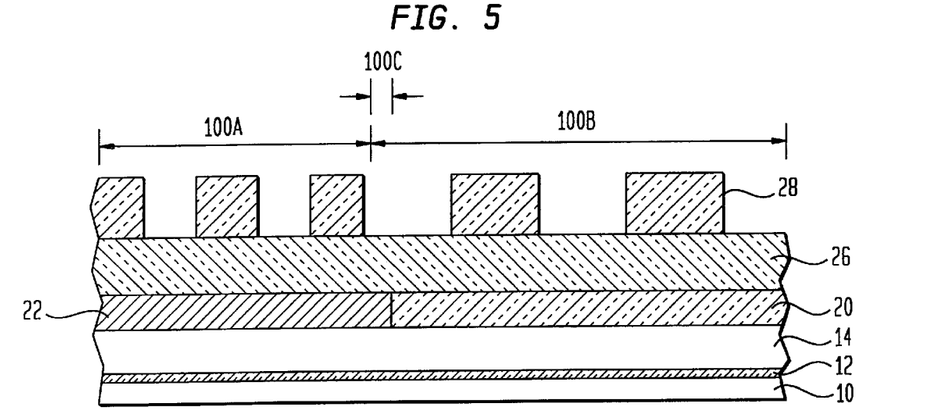

As is shown in FIG. 4, the planarized surface 21 of the stack is then covered in turn with a capping layer 26 of silicon nitride and a masking layer 28 of a suitable photoresist, for example one useful at the deep ultra-violet range (DUV) of photolithographic patterning. The masking layer 28 is then patterned to leave the stack as is shown in FIG. 5.

As will appear later, this pattern in the masking layer 28 will largely determine the regions of the silicon substrate 10 that will ultimately be doped, n-type in the array portion 100A and either p-type or n-type in the support portion 100B to form the source and drains of the transistors of both the memory cells and the support circuitry to be formed in the silicon substrate.

Figure 6:
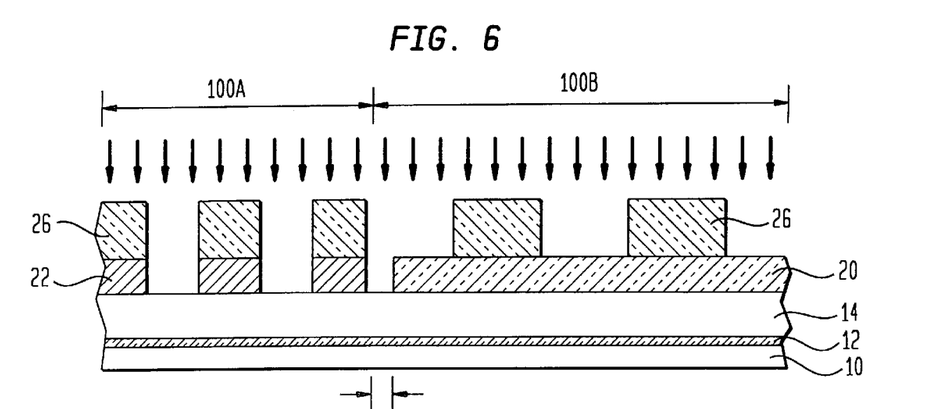

There then follow several etch steps, the result of which is shown in FIG. 6. First, the silicon nitride 26 is etched, stopping at the polycide layer 22 in array portion 100A and at oxide layer 20 in support portion 100B. The photoresist mask 28 is then stripped and a timed polycide etch is performed to etch through the polycide layer 22 where exposed. This etch is chosen not to etch silicon oxide and so the silicon oxide layer 20 in support portion 100B of the stack is little disturbed and remains unpatterned, while the polycide 22 in array portion 100A is patterned. The opening 100C shown in FIG. 6 between the silicon oxide layer 20 and the first of the polycide segments 22 is determined by the encroachment mentioned above of the polycide layer 22 into the support portion of the stack.

As is shown schematically in FIG. 6, there now follows irradiation of the stacked structure with n-type dopant ions 30 to implant such ions into the exposed portions of polysilicon layer 14 in the array portion 100A. This is followed by a thermal anneal that results in the lateral diffusion of the n-type dopants from the doped exposed polysilicon region of layer 14 into the adjacent polysilicon regions of layer 14 that were not directly irradiated because of the overlying portions of polycide regions 22 and of nitride regions 26.

Figure 7:
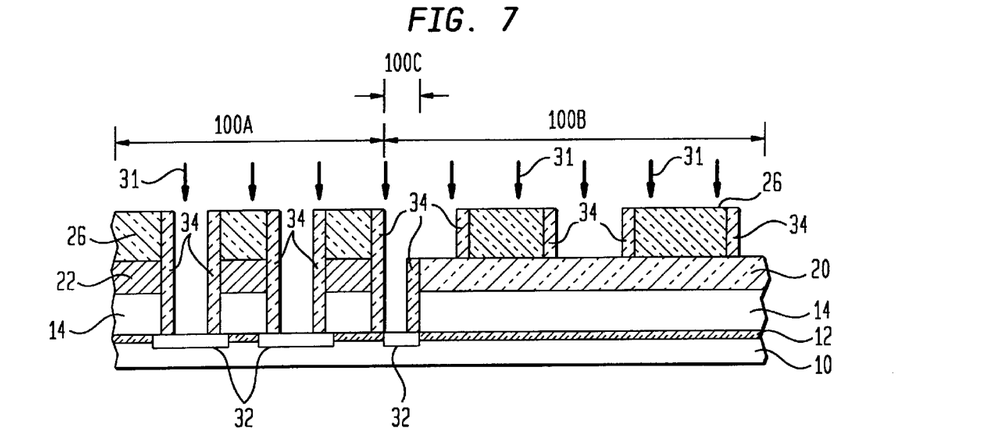

Next the exposed polysilicon regions of layer 14 are etched down to the silicon oxide layer 12 both in the array portion and in a narrow region 100C mentioned earlier between the array portion 100A and the support portion 100B. Then the stack is again radiated with n-type ions to implant such ions 31 into exposed regions of the silicon substrate 10 to form localized n-type regions 32 that will serve as the source/drain regions of the N-MOSFETs in the memory cell array portion. Then sidewall dielectric spacers 34, typically of silicon nitride, are formed on the sidewalls of the various stacks that are on the top surface of the chip, as is shown in FIG. 7. These can be formed in known fashion for forming sidewall spacers. These will serve later with portions of the silicon nitride layer 26 for the selective borderless contact etch in the array portion of the stack as part of the salicide process.

Figure 8:
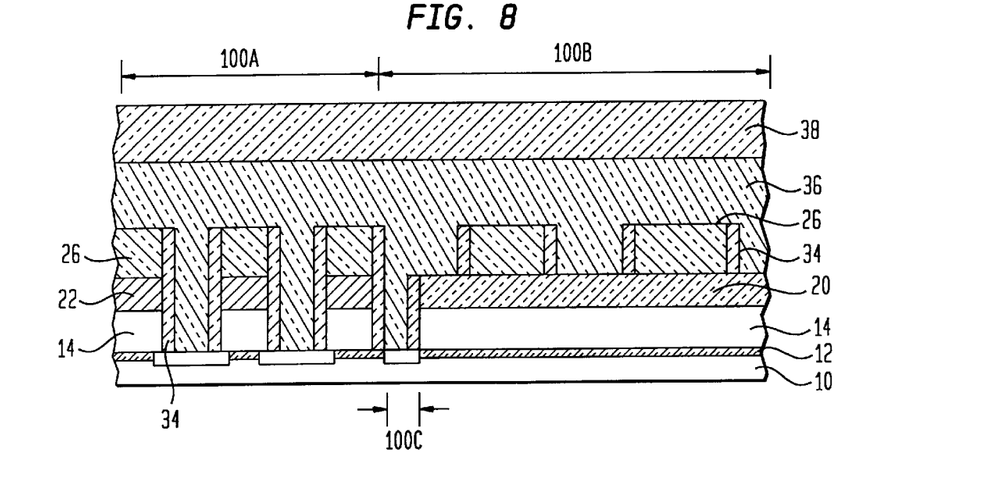

Next, as is shown in FIG. 8, a layer 36 of a suitable capping dielectric, such as a borophosphosilicate glass (BPSG) is deposited over the whole stack. Generally, to prevent the self aligned contact etch in array region 100A from punching through the gate oxide layer 12, it is advantageous, first to put down a thin liner layer, typically of silicon nitride or silicon oxynitride (not shown). Thermal reflow is used to fill the gaps so that the stack surface is almost planar again. Now processing of the memory cell array portion of the stacked structure is largely completed. Next there follows deposit of a photoresist masking layer 38 over the entire top surface of the stacked structure, also as is shown in FIG. 8.

Figure 9:
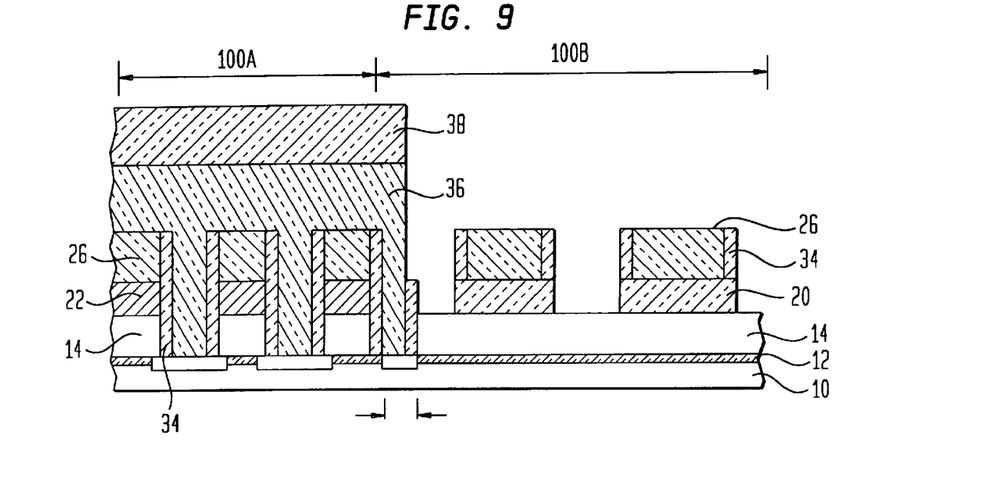

The photoresist masking layer 38 is then structured by standard photolithography and the BPSG layer 36 is then etched away in turn from the support portion 100B of the stack, typically by reactive ion etching (RIE). There results the stacked structure shown in FIG. 9, where the BPSG layer 36 and photoresist layer 38 are limited to the array portion 100A of the stacked structure. The reactive ion etching used advantageously is chosen to be selective to etch both silicon nitride and polysilicon so that there are also etched the exposed portions of silicon oxide layer 20. As a result the pattern of the SiN cap nitride layer 26 and the sidewall spacers 34 is transferred down into the silicon oxide layer 20, as is shown in FIG. 9.

Figure 10:
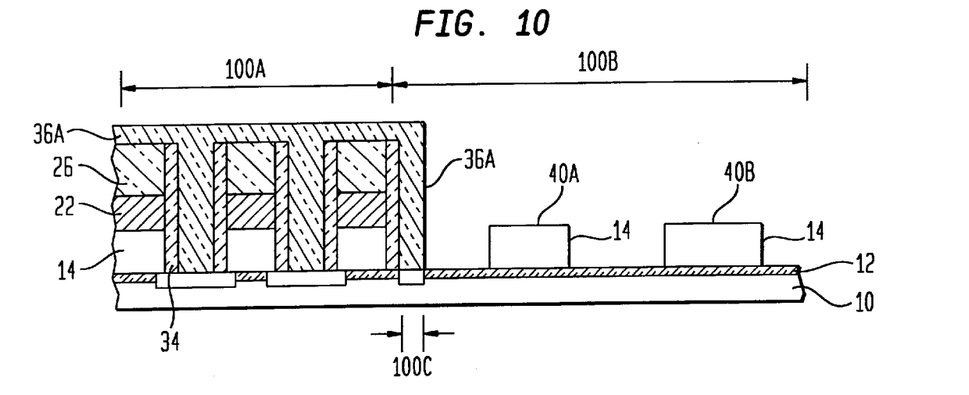
Figure 11:
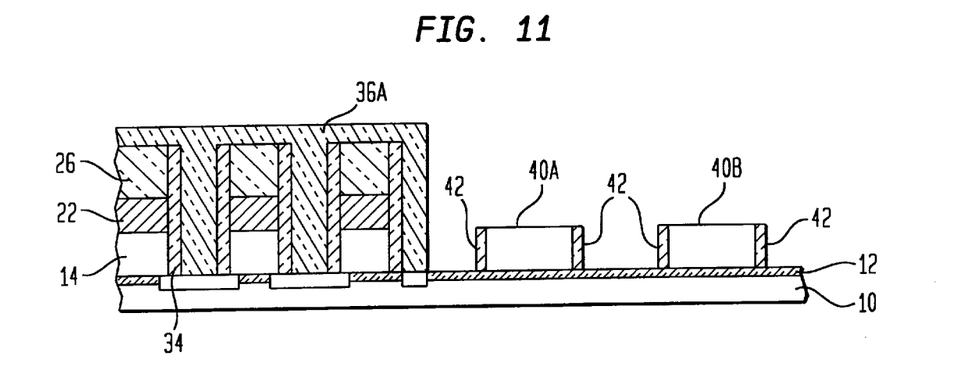

The photoresist 38 is now be removed from the memory array portion 100A. Then, in the support portion 100B, the SiN cap layer 26 is stripped away by etching and the etch is completed down to the gate oxide 12 to reach the result shown in FIG. 10. Also, as shown, the undoped polysilicon layer 14 is also patterned to leave mesas 40A and 40B of undoped polysilicon over the silicon substrate 14. The oxide that has been formed in the course of the earlier processing on the top of polysilicon layer 14 serves as a hard mask to protect mesa portions 40A and 40B of layer 14. After mesa formation the oxide layer 20 is stripped, preferably by a wet etch, e.g., HF. Because of the earlier removal of the photoresist layer 38, the BPSG layer 36 that remained in the portion 100C and array portion 100A, also will be thinned (as is shown by layer 36A) during such etching, as is shown in the structure of FIG. 10. It is noted that gate oxide layer 12 is not etched because it is protected by the thin silicon nitride layer (not shown but described above) deposited prior to film 36.

Silicon nitride spacers 42 are now formed on the tops and sides of mesas 40A and 40B using standard conventional techniques. It may be necessary to provide sidewall oxide prior to forming spacers 42. This may be done by exposing the stack structure shown in FIG. 10 to an oxidizing atmosphere at an elevated temperature. This results in a thin oxide layer being formed on the sides and top of mesas 40A and 40B.

The forming of sidewall spacers 42 will result in the removal of the nitride layer on top of the gate oxide layer 12 which is mentioned above.

Figure 12:
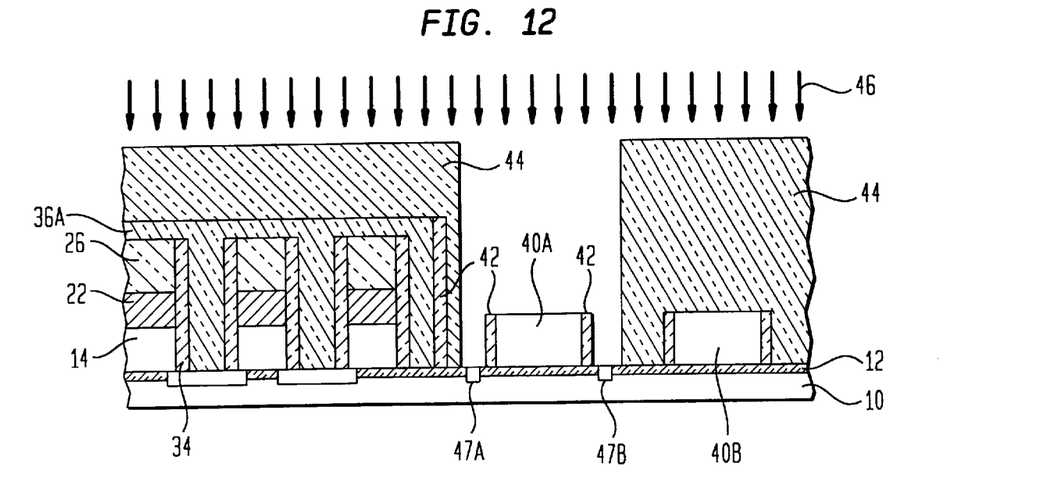

Then the structure is covered with a layer 44 of a photoresist, which is then patterned, as is shown in FIG. 12, to expose only the region including polysilicon mesa 40A of support portion 100B where there is to be formed the N-MOSFET of the complementary pair of the support circuitry.

Then, as is schematically shown in FIG. 12, the stack is irradiated with donor ions 46 to implant donor ions in polysilicon mesa 40A and in the exposed regions 47A and 47B of the silicon substrate 10, on either side of mesa 40A. After annealing, these regions 47A, 47B become the source and drain, respectively, of the N-MOSFET of the support circuitry. Also the polysilicon mesa 40A is also doped similarly n-type for better serving as the gate conductor of the N-MOSFET.

Figure 13:
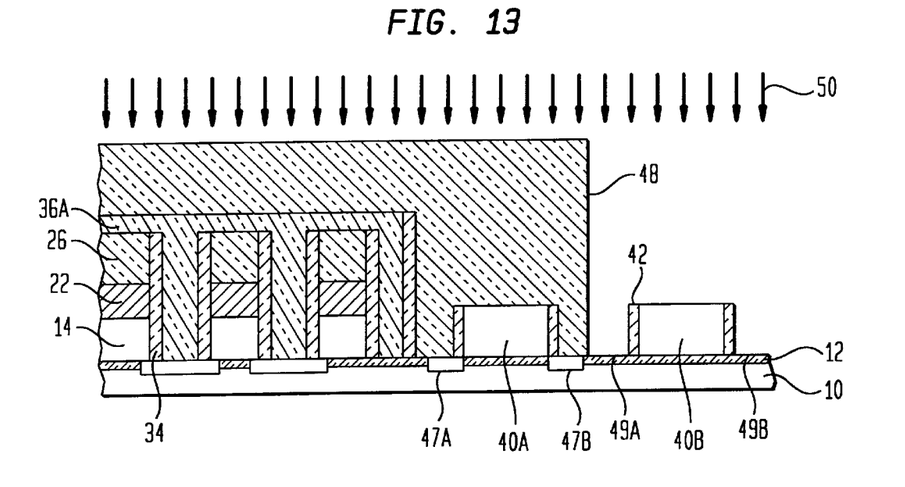

Next all of the photoresist mask 44 is stripped away and it is replaced by another photoresist mask 48 that is patterned to leave exposed only the support portion region including mesa 40B where the P-MOSFET is to be formed, as is shown in FIG. 13. Then, as is shown schematically in FIG. 13, the stack is irradiated with acceptor ions 50 to dope p-type the exposed portion of 49A and 49B of the silicon substrate 14 on either side of polysilicon mesa 40B and the mesa itself to better adapt it for serving as the gate conductor of the P-MOSFET of the support circuitry. Portions 49A and 49B, after annealing, become the source and drain, respectively, of the P-MOSFET of the support circuitry and the doped mesa 40B becomes the gate conductor.

Figure 14:
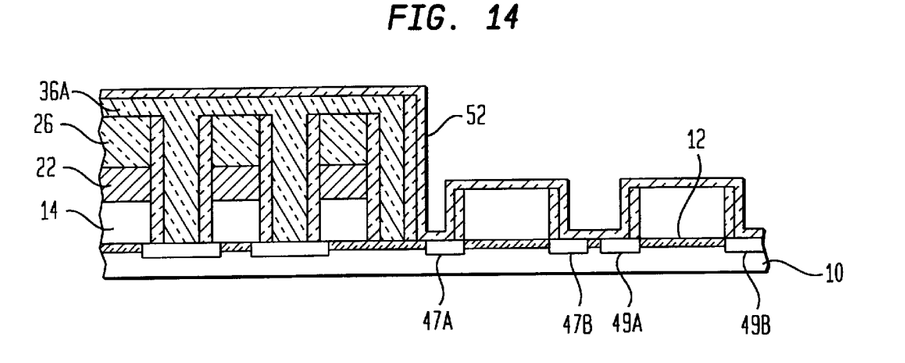

Now the mask 48 is stripped away and an HF etch is performed to remove the gate oxide 12 between the mesas 40A and 40B and any residual oxide on top of the mesas 40A and 40B. Then a film 52 of a suitable metal, typically titanium or cobalt, is deposited typically by sputtering over the entire stack, as is shown in FIG. 14. This film 52 will be used to form the self-aligned silicide (salicide) contacts over the surfaces of the polysilicon mesas 40A and 40B. After a thermal anneal, salicide ohmic contacts will form wherever the film 52 directly contacts silicon such as at the exposed top surfaces of mesas 40A and 40B, and at the implanted surface regions 47A, 47B, 49A and 49B of the silicon substrate 10. Accordingly, these contacts, which will serve as the source and drain electrodes, respectively, will be self-aligned with the source and drain regions.

Figure 15:
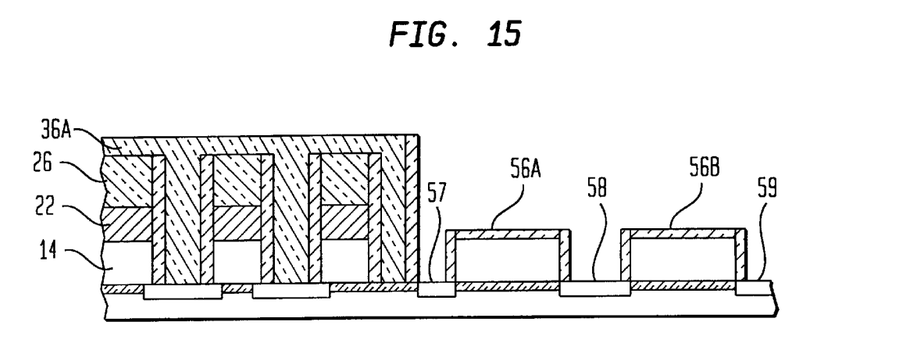

After such deposit and anneal, a wet etchant is used to strip away excess metal of film 52 that did not react with exposed silicon leaving isolated the salicide contacts 56A and 56B, that have fused with polysilicon gate conductors 40A and 40B, respectively, and the salicide contacts 57, 58 and 59 that have fused with implanted source/drain regions 47A, 47B, 49A and 49B of the silicon substrate 10, as is shown in FIG. 15. Implanted regions 47B and 49A may form a single salicide contact 58 if needed within CMOS circuitry, as is shown in FIG. 15. However, as is well known, different devices can also be electrically isolated from each other by techniques such as shall trench isolation or LOCOS oxidation. For simplicity purposes these particular features are not shown. It is noted that the present invention can be applied to both isolated devices as well as to devices with a single salicide contact 58, as is shown in FIG. 15.

Figure 16:
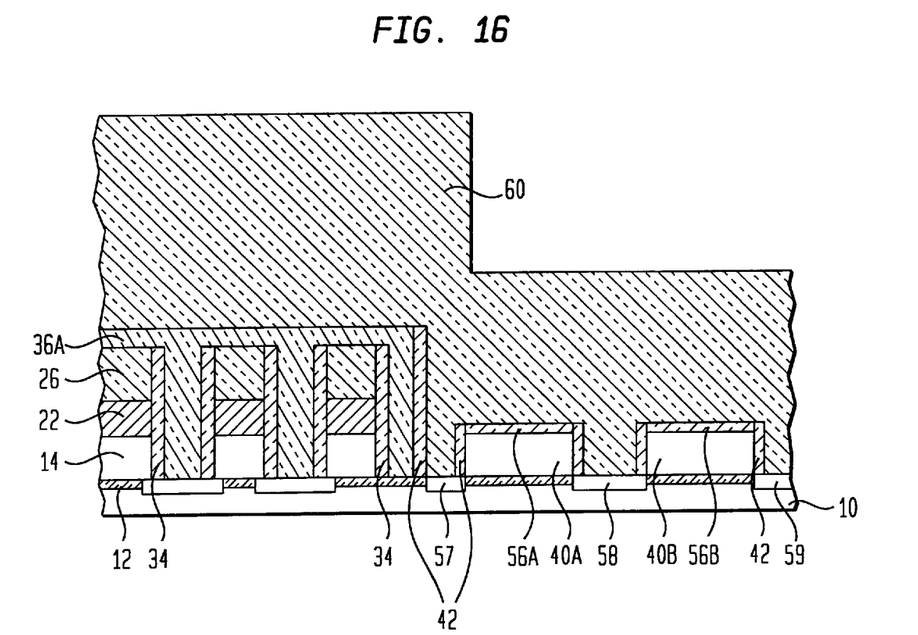

Now, after a suitable liner (not shown) advantageously is applied over the surface of the stack, a new capping layer 60 of a dielectric, such as BPSG is deposited over the stack, as is shown in FIG. 16.

It is to be noted that in the instant case, because the height of the gate region mesas 40A and 40B in the support portion 100B can be relatively low, the aspect ratios of the gaps in the support portion 100B between the N-MOSFET and the P-MOSFET to be filled are not especially stringent, as compared to those encounters in prior art structures. Hence the fill of these gaps can be accomplished with relatively lower processing temperatures than with the prior art structures. A slight densification of the BPSG 60 by heating at 600° C. for a short time may be desirable to make the CMP rates for BPSG layer 60 and the remainder of BPSG layer 36 more comparable to facilitate planarization.

Figure 17:
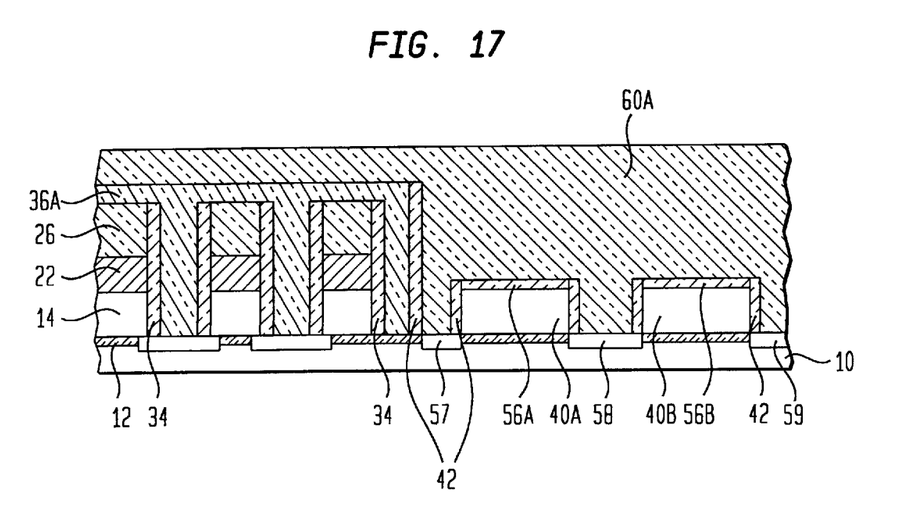

Finally the layer BPSG 60 over the stack is planarized, advantageously by CMP, to leave the resulting planarized layer 60A as is shown in FIG. 17.

The rest of the process to provide to various contacts to the array and support transistors as well as the conductive interconnects, such as the bit and word lines, can be done in conventional fashion. Similarly, capacitors that are used to provide the storage nodes of the memory cells can be provided at suitable locations on the surface of the silicon chip, advantageously as a trench or an appropriate multilayer stack, in conventional fashion. By appropriate changes in the process, there also can be used trench capacitors.

It should be apparent that various modifications in the process described, which is illustrative of one embodiment of the invention, may be devised without departing from the spirit and scope of the invention. In particular, changes can be made in the particular metals described, for example in forming the polycides and salicides, or in the dielectrics used. Similarly, other possible changes include rearrangement in the order of the steps performed or in the substitution of vapor diffusion as a substitute for ion implantation in some of the doping steps. In particular, if desired to improve the quality of transistors of the DRAM, portions of the silicon oxide layer 12 that had been formed over the monocrystalline silicon substrate 10 early in the processing could be removed and replaced by a new dielectric layer for use as the gate dielectric later in the processing, for example, just before the ion implantations for forming the source and drain regions. Different regions of substrate 10 can have formed thereon different thicknesses of silicon oxide layer 12.

The invention might also be used with appropriate modifications to use P-MOSFETs instead of N-MOSFETs in the memory cell array portion of the chip, and also for forming integrated circuits other than DRAMS where there is a large area of one type of transistors surrounded by areas where both types of transistors are included.

What is claimed is:

1. A method for forming a DRAM that comprises a silicon chip in which the central area of the chip includes arrays of memory cells that use N-MOSFETs and the peripheral area of the chip includes support circuitry that uses C-MOSFETs comprising the steps of:

forming over the surface of the chip area a masking layer of silicon oxide and removing the layer selectively from the central portion where the memory cell arrays are to be included, but leaving a portion of the masking layer in the peripheral area where the support circuitry is to be included;

forming the N-MOSFETs of the memory cells in the central area and including in such N-MOSFETs gate conductors that include an underlying polysilicon layer that is doped with donor atoms and an overlying layer that is a metal silicide;

covering the chip area with a masking layer and removing the masking layer selectively from the central area of the chip;

removing said silicon oxide layer from the peripheral portion of the chip area;

covering said peripheral portion with a masking layer and removing a portion of the masking layer where N-MOSFETs of the support circuitry are to be formed;

forming the N-MOSFETs of the support circuitry in the peripheral portion and including in such N-MOSFETs gate conductors that include an underlying polysilicon layer that is doped with donor atoms and an overlying layer that is a metal silicide;

covering the peripheral area with a masking layer and removing a portion of the masking layer where P-MOSFETs are to be formed; and forming the P-MOSFETs of the support circuitry in the peripheral portion and including in such P-MOSFETs gate conductors that include an underlying silicon layer that is doped with acceptor atoms and an overlying layer of a metal silicide.

2. The process of claim 1 in which in the peripheral portion of the chip area there is patterned an undoped polysilicon layer to form a plurality of mesas on a silicon substrate and mesas that are to be the gate conductors of N-MOSFETs are implanted with donor ions and mesas that are to be the gate conductors of P-MOSFETs are implanted with acceptor ions, a gate dielectric being included between the mesas and the silicon substrate.

3. The method of claim 2 in which the ion implantations also serve to form source and drain regions of the transistors on opposite sides of the mesas.

4. The method of claim 3 in which after being ion implanted, the mesas and the source and drain regions are covered with a layer of a metal, and then by heating the chip salicide contacts are formed selectively to the source and drain regions.

5. A method of fabricating a dynamic random access memory, comprising the steps of:

forming a first silicon oxide layer over a top surface of a silicon substrate layer in which are to be formed both N-MOSFETs suitable as memory cell transistors and complementary N-MOSFET and P-MOSFET pairs suitable for support circuitry;

stacking over the oxide first layer a second layer of undoped polysilicon;

stacking over the undoped polysilicon second layer a third layer of silicon oxide;

patterning the silicon oxide third layer to remove portions where the memory cell transistors are to be formed;

depositing over the stack a fourth layer of a polycide;

planarizing the resulting stacked structure essentially at the level of the silicon oxide third layer;

forming over the planarized stack a fifth layer of silicon nitride;

patterning the fourth and fifth layers to form gaps in the fourth and fifth layers for exposing regions of the polysilicon second layer where dopants are eventually to be implanted in the silicon substrate for forming source and drain regions in the silicon substrate;

implanting n-type ions into the exposed regions of the undoped polysilicon second layer underlying the gaps in the fourth and fifth layers;

etching to remove the exposed regions of the polysilicon second layer not covered by the fourth and fifth layers down to the silicon oxide first layer, thereby forming gaps to the first layer;

implanting the stack with n-type dopants to form n-type source/drain regions selectively in the silicon substrate layer at the deeper gaps not covered by the fourth and fifth layers;

forming dielectric spacer layers on the sidewalls of the gaps formed in the fourth and fifth layers;

covering the stack with a layer of a glass and filling the gaps using thermal reflow;

patterning the glass to expose the support portion of the stack where the complementary circuits are to be formed and to expose regions of the silicon oxide third layer where not covered by the silicon nitride fifth layer and its sidewall spacer layers;

patterning the silicon oxide third layer and the undoped polysilicon second layer in the support portion where not masked by the remaining silicon nitride fifth layer;

and etching away in the support portion the remaining silicon nitride fifth layer, its underlying silicon oxide third layer, and the exposed portions of the undoped polysilicon layer second layer;

forming dielectric side wall spacers on the exposed undoped polysilicon second layer;

covering the stack with a masking layer that is patterned to open windows above the regions where N-MOSFETs are to be formed in the support portions;

implanting n-type dopant ions into the silicon substrate not covered by the previously undoped polysilicon second layer in the array and into the previously undoped polysilicon second layer in the support portions to form the source/drain regions of the N-MOSFETs in the support portions;

covering the stack with a masking layer that is patterned to open windows above the regions where P-MOSFETs are to be formed in the support portions;

implanting p-type ions into the exposed silicon substrate and previously undoped polysilicon second layer in the support regions to form the source/drain regions of the P-MOSFETs in the support;

removing the masking layer from the stacked structure;

depositing over the stacked structure a layer of a metal layer suitable to create self aligned polycide contacts to the exposed source/drain regions and to the exposed p-type and n-type doped polysilicon of the second layer in the stacked structure;

heating the stacked structure to create salicide contacts selectively where the metal layer contacts silicon;

then etching the stack to remove the metal layer where it did not react to form the salicide contacts;

depositing a capping layer over the stacked structure; and planarizing the capping layer.

6. A method for forming a stack that includes a monocrystalline silicon p-type substrate in which N-MOSFETs are formed in a central area, the MOSFETs to serve as the array transistors of a dynamic random access memory and C-MOSFETs are formed in a peripheral area, the MOSFETs to serve as its support circuitry comprising the steps of:

forming on the top surface of the monocrystalline silicon substrate a dielectric first layer;

stacking on the dielectric first layer an undoped polysilicon second layer;

stacking on the undoped polysilicon second layer a silicon oxide third layer;

patterning the silicon oxide third layer to expose portion of the polysilicon second layer where the array transistors are to be formed;

stacking on the exposed portion of the polysilicon second layer and the remaining portion of silicon oxide third layer a silicide fourth layer;

planarizing the stack essentially to the level of the remaining portion of the silicon oxide third layer;

stacking a silicon nitride fifth layer over the planarized stack;

patterning the silicon nitride fifth layer and underlying silicide fourth layer to expose portions of the polysilicon second layer in the array region of the stacked structure and portions of the silicon nitride fifth layer in the support circuitry region of the stacked structure to form gaps in the stack;

irradiating the stack with donor ions to implant donor ions in the exposed portion of the undoped polysilicon second layer in the array region of the stacked structure for diffusion throughout the polysilicon array region of the stack;

etching the exposed portions of the polysilicon second layer down to the gate dielectric first layer;

irradiating the stack again with donor ions to implant donor ions through the exposed portions of the gate dielectric first layer and into the underlying monocrystalline silicon substrate layer to form n-type regions in the silicon p-type substrate suitable for use as the source and drain regions of the N-MOSFETs;

forming dielectric spacers in the side walls of the gaps in the stack;

forming a masking layer over the stack and removing a portion of the masking layer from the peripheral area where the C-MOSFETs of the support circuitry are to be formed;

etching in turn in the peripheral area the exposed silicon oxide third layer, the undoped polysilicon second layer and the exposed gate dielectric first layer to leave exposed in the peripheral area mesa regions of the undoped polysilicon second layer and regions of the underlying gate dielectric first layer;

forming dielectric spacer layers on the side walls of said mesa regions of undoped silicon;

irradiating the stack to implant donor ions into the exposed portions of the monocrystalline silicon substrate and the undoped polysilicon substrate where the N-MOSFETs are to be formed in the support circuitry region of the stacked structure;

covering the portions of the stack where the N-MOSFETs are to be formed and uncovering the portions of the stack where P-MOSFEts are to be formed; and irradiating the stack with acceptor ions to implant acceptor ions in the exposed silicon monocrystalline substrate and in the exposed undoped polysilicon where the P-MOSFETs are to be formed in the stack.

* * * * *